United States Patent [19]
Wang et al.

[11] Patent Number: 5,587,336
[45] Date of Patent: Dec. 24, 1996

[54] BUMP FORMATION ON YIELDED SEMICONDUCTOR DIES

[75] Inventors: Tsing-Chow Wang, San Jose; Serena M. Luo; Marlita F. Macaraeg, both of Milpitas; Francisca Tung, Los Gatos; Thomas J. Massingill, Scotts Valley, all of Calif.

[73] Assignee: VLSI Technology, San Jose, Calif.

[21] Appl. No.: 353,022

[22] Filed: Dec. 9, 1994

[51] Int. Cl.⁶ ................................................. H01L 21/283
[52] U.S. Cl. ........................ 437/183; 437/190; 437/192
[58] Field of Search ................................ 437/183, 190, 437/192, 189

[56] References Cited

U.S. PATENT DOCUMENTS

| | | | |
|---|---|---|---|
| 3,585,461 | 6/1971 | Eynon et al. | 437/183 |
| 4,237,607 | 9/1980 | Ohno | 437/183 |
| 4,927,505 | 5/1990 | Sharma et al. | 204/34.5 |
| 5,008,997 | 4/1991 | Phy | 29/827 |
| 5,108,950 | 4/1992 | Wakabayashi et al. | 437/183 |
| 5,130,275 | 7/1992 | Dion | 437/225 |
| 5,171,712 | 12/1992 | Wang et al. | 437/183 |
| 5,173,449 | 12/1992 | Lorenzen et al. | 437/192 |
| 5,289,038 | 2/1994 | Amano | 257/780 |
| 5,298,459 | 3/1994 | Arikawa et al. | 437/183 |
| 5,436,198 | 7/1995 | Shibata | 437/183 |

OTHER PUBLICATIONS

Liu, T. S., et al., A Review of Wafer Burning for Tape Automated Bonding, Solid State Tech. (Mar. 1980) pp. 71–76.

Bonkohara, M., et al., Utilization of Inner Lead Bonding Using Ball Bump Technology, ITAB '92 Proceedings pp. 86–96.

*Primary Examiner*—T. N. Quach
*Attorney, Agent, or Firm*—Karen S. Perkins

[57] ABSTRACT

The ball bump structure of the subject invention provides a hermetically sealed bond pad at the surface of a semiconductor chip. An adhesion pad is formed at the surface of the bond pad. The adhesion pad includes a barrier layer, preferably a titanium/tungsten alloy, and a bonding layer, for example, a sputtered gold layer. A gold ball bump is formed on the adhesion pad. Methods for forming the improved structure herein are also disclosed.

3 Claims, 2 Drawing Sheets

BUMP FORMATION ON YIELDED SEMICONDUCTOR DIES

TECHNICAL FIELD

This invention relates to methods and materials involving the formation of reliable ball bumps for TAB connection of bond pads to inner lead fingers. The improved bonding pad/ball bump structure is formed using a wire bonding tool rather than the plating methods of the prior art.

BACKGROUND OF THE INVENTION

TAB technology is commonly used when high lead counts and small package size are desired. When TAB connections are made, an electrically conductive bead (or "bump") connects the die input or output to an electrical lead. The bump acts to provide an electrical connection which brings the effective electrical path of the bond pads above the level of the integrated circuit surface. A parallel technology provides bumps on the lead tape for TAB processing.

In traditional batch bump-forming processes, all the dies on a wafer, whether good or bad, are processed to provide bumps at each possible bond pad. These methods are commonly used when a large number of small-sized chips are present on the wafer. TAB bumps can be formed by batch processes such as evaporation through a mask, or plating using a photoresist pattern. Evaporated bump formation is limited by deposition efficiency: a large portion of the evaporated gold ends up on the mask. Although the gold is recoverable, the additional processing required to retrieve the gold raises the over-all costs. In addition, the resulting bumps have less-than-optimal geometry, and are not necessarily uniform in height. The cost of photoresist medium limits the desirability of photoresist methods. Additionally, photoresist bump formations exhibit low adhesion properties if the surface is not scrupulously cleaned prior to plating.

When a relatively small number of larger dies are present on a wafer, it can be cost effective to form individual ball bumps in position on the good dies, and minimize further processing of the bad dies. Ball bump formation, in which the bump is formed using a Ball Bumper, provides an alternate to traditional TAB bump formation. As shown in FIG. 1, a traditional bond pad/ball bump structure 10 includes a bump 12 of gold metal which is formed on an aluminum pad 14. A passivation layer 16 covers the surface of the integrated circuit die 18.

Prior art ball bump formation generally begins with sorting of the dies on a yielded semiconductor wafer. Dies are tested, good dies are noted, and bad dies are inked. Alternately, the bad dies can be marked using a laser, or computer-mapped. Gold bumps are formed directly on the aluminum bond pad using a Ball Bumping machine to produce a structure such as that shown in FIG. 1. Individual ball bumps are bonded to individual leads (not shown) using a device such as a single point bonder.

Current ball bumping methods and structures exhibit limitations and drawbacks. The bonding between gold and aluminum is not preferred, as it is difficult to produce a strong and durable bond. Insufficient bonding between the gold ball and the aluminum bond pad can produce bond failure. Temperature-dependent bond failures are especially troublesome, as they may be intermittent and difficult to detect.

Ball bump structures of the prior art are subject to corrosion, especially at the gold/aluminum interface, where gold/aluminum intermetallic formations can lead to bond failure. Moisture and other chemicals can intrude into the bond, causing bond failure.

Because of the temperatures and pressures involved with ball bumping, ball bumps of the prior art must be bonded to the lead system individually, which requires significant bonding time. Prior art attempts at mass ball-bumping or mass coining have resulted in chip cracking, unreliable dies, and chip failure.

SUMMARY OF THE INVENTION

The subject invention provides a hermetically sealed bond pad/ball bump structure which resists corrosion. The improved ball bump system provides an adhesion pad which provides improved bonding characteristics at the bond pad and at the bump, while providing a physical barrier to chemical corrosion. The enhanced structure is appropriate for mass ball-bumping, in which an entire chip, or entire wafer, has ball-bumps formed substantially simultaneously.

The adhesion pad includes two layers: a barrier layer adjacent the aluminum bond pad, and a bonding layer above the adhesion pad. The barrier layer provides a hermetic seal which encloses and adheres strongly to the aluminum bond pad, protecting the bond pad from extremes of temperature and the incursion of moisture or chemicals. The bonding layer is formed above the barrier layer, and adheres strongly to the barrier layer. The bonding layer is preferably gold, and provides an excellent substrate for ball bump formation and adhesion to the semiconductor chip. A gold ball bump is then formed over the bonding layer of the adhesion pad.

The adhesion pad includes two separate layers: a barrier metallization layer (preferably titanium/tungsten alloy, or chromium) adjacent the aluminum pad, and a bonding layer (preferably gold) above the barrier metallization layer(s). A gold ball bump is formed on the adhesion pad structure. The ball bumps of the subject invention are amenable to multiple-pad bonding, in which a plurality of ball bumps are each simultaneously bonded to an individual lead.

In one embodiment, the step of forming an adhesion pad on the bond pads includes depositing the adhesion material onto the surface of the wafer; coating the wafer with a photoresist material; processing the photoresist material to define the adhesion pad above the bond pad; etching the adhesion material not protected by the photoresist; and removing the photoresist.

The preferred process for ball bumping comprises the steps of forming the adhesion pad on the bond pad; sorting the wafer and marking the bad dies; and forming a ball bump on the adhesion pad. The wafer is then diced, and good chips are processed by TAB methods and encapsulated in a standard package.

BRIEF DESCRIPTION OF THE DRAWINGS

The Figures are drawn for clarity and are not drawn to scale. Similar numbers refer to similar structures throughout the Figures.

DISCLOSURE OF THE INVENTION INCLUDING BEST MODE

The invention herein provides an improved bond pad/ball bump structure which includes an intermediate adhesion pad. The adhesion pad acts to provide a hermetic seal across the bond pad, and to provide a preferred substrate for the adhesion of the ball bump.

The adhesion pad consists of two layers. A first layer is the barrier layer, which is proximate the semiconductor chip surface, and which, at its lower surface, provides a good physical bond to each of the passivation layer and the bond pad. Together with the bonding layer, it provides a good electrical path between the ball bump and the bond pad. The barrier layer prevents gold/aluminum intermetallic formations.

The second layer is the bonding layer. The bonding layer exhibits good bonding to the barrier layer, and excellent adhesion to the ball bump. Preferably the bonding layer is gold. A gold/gold bond between the bonding layer and the ball bump is extremely stable.

Figure 1:
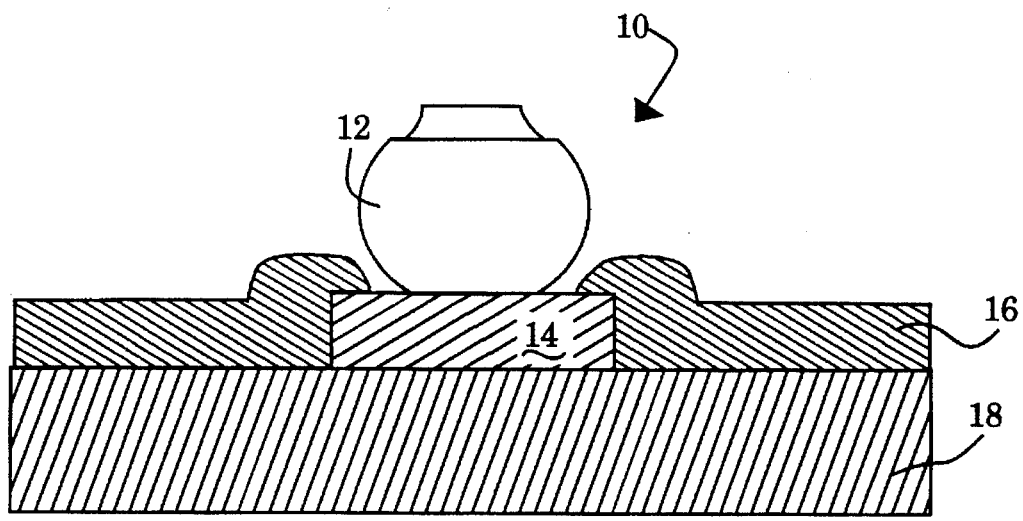
FIG. 1 shows a cross-sectional view of a bond pad and bump ball of the prior art.
Figure 2:
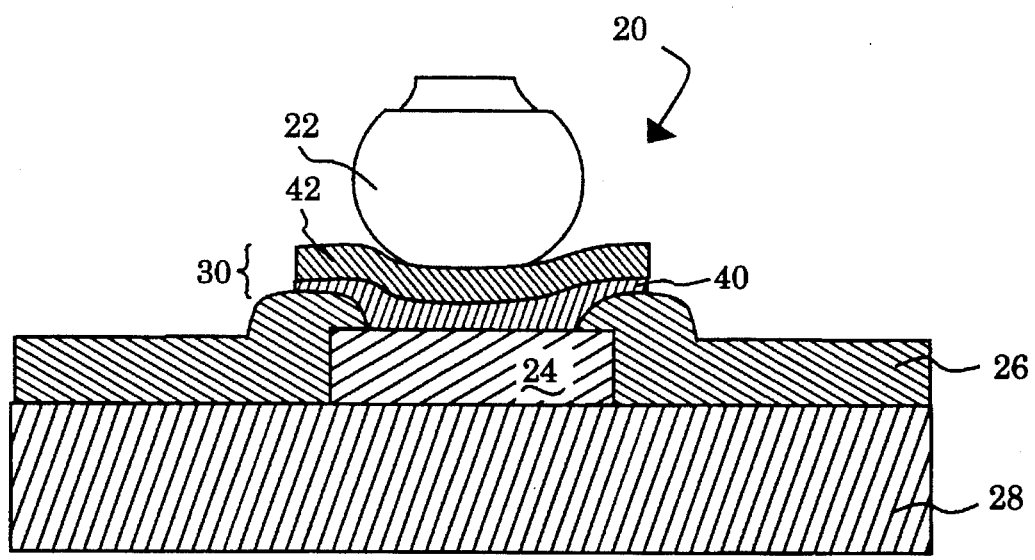
FIG. 2 shows a cross-sectional view of a bond pad, adhesion pad, and bump ball of the subject invention.

One embodiment of the invention herein is shown in FIG. 2. The structure 20 provides a bond pad 24 at the surface of a semiconductor chip 28. The bond pad 24 has a passivation layer 26 about the perimeter. The improvement comprises an adhesion pad 30, which is formed at the surface of the bond pad 24. The adhesion pad consists of two layers. The lower layer is a barrier layer 40, while the upper layer is a bonding layer 42. A ball bump 22 is formed over the bonding layer 42.

The passivation layer 26 can be any appropriate material, and is commonly silicon dioxide or silicon nitride. The passivation layer 26 protects against degradation of the chip through chemical action, corrosion, and handling. It is commonly formed as a blanket across the surface of the wafer in one of the last processing steps. Using conventional techniques, a mask is used to define the bond pads 24, and the passivation layer 26 is selectively removed to expose the bond pads 24. The bond pads 24 can be made of any appropriate material. Most commonly they are made of aluminum.

The barrier layer 40 of the adhesion pad 30 comprises one or more strata of a material which forms a good bond with the (usually aluminum) bond pad, and a good bond with the material which forms the bonding layer (usually gold). Chromium, palladium, platinum, and titanium/tungsten alloys are generally preferred. More generally, chromium and titanium/tungsten alloys are appropriate. Preferably, it is an alloy of approximately 10 parts titanium to 90 parts tungsten by atomic weight. More generally, the alloy can be from about 8 to about 12 parts per hundred titanium, the balance being tungsten. As discussed with reference to the method, below, the titanium/tungsten alloy can be "nitrogen stuffed" by deposition under a nitrogen/noble gas atmosphere. As shown, the thickness of the adhesion pad 30 will vary with the substrate, but it generally averages from between about 0.2 µm to about 0.3 µm. Preferably, the adhesion pad 30 overlaps the passivation layer 26 to some extent. An overlap of from less than about 5 µm to greater than about 10 µm can be used.

The adhesion pad 30 also includes a bonding layer 42, located external to the barrier layer 40. The presence of this bonding layer 42 promotes a good bond between the barrier layer 40 (and thus the underlying bond pad 24) and the ball bump 22. Additionally, the bonding layer 42 can serve to protect the underlying layers from contamination when the die is exposed to the atmosphere.

The bonding layer 42 acts to provide a good mating surface for the ball bump. When the ball bump is gold, for example, it is preferred that the barrier layer 40 is also gold. Besides providing a preferred metallurgical surface for the ball bump bond, the ball bumping processes itself may also be simplified by use of this bonding substrate. Providing a gold bonding layer 42 eliminates the need for a gold strike and reduces pre-cleaning requirements. Sputtered gold is preferred, as it will adhere to a foreign surface better than either evaporated or plated gold. This assures that the structural integrity of the adhesion pad is maximized, and that the adhesion of the gold ball bump to the adhesion pad is maximized. Generally, the gold layer is from about 1800 Å to about 2200 Å, and more preferably about 2000 Å, in thickness.

Figure 3:
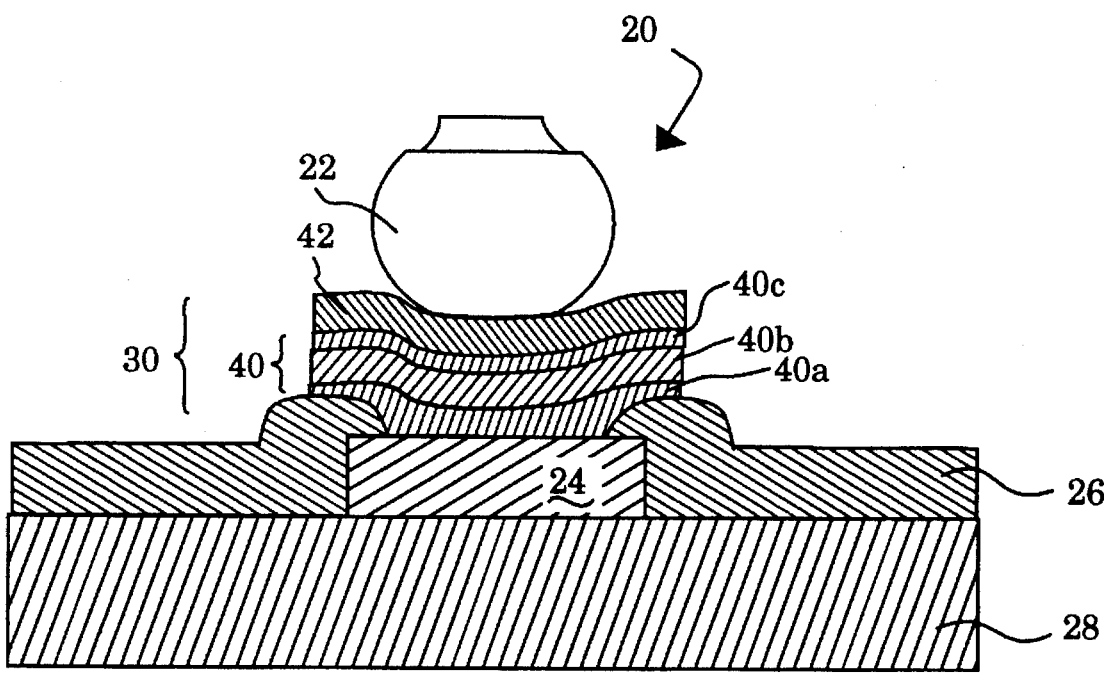
FIG. 3 shows an alternate cross-sectional view of a bond pad, adhesion pad, and ball bump of the subject invention.

In an alternate embodiment, shown in FIG. 3, the barrier layer 40 includes more than one strata of barrier material. As discussed above, the structure 20 provides a bond pad 24 at the surface of a semiconductor chip 28. The bond pad 24 has a passivation layer 26 about the perimeter. The improvement comprises an adhesion pad 30, which is formed at the surface of the bond pad 24. The adhesion pad 30 consists of two layers, an upper bonding layer 42, and a lower barrier layer 40. The barrier layer 40 is shown with three separate strata, 40a, 40b and 40c. A ball bump 22 is formed over the bonding layer 42.

In the pictured embodiment, the barrier layer 40 of the adhesion pad 30 comprises three separate titanium/tungsten layers 40a, 40b, and 40c. Each layer is an alloy of approximately 10 parts titanium to 90 parts tungsten by atomic weight. More generally, the alloy can be from about 8 to about 12 parts titanium by atomic weight, the balance being tungsten. The lowermost layer 40a, immediately adjacent the aluminum bond pad, is deposited under a noble gas such as argon. It is generally from about 300 Å to about 700 Å, more preferably about 500 Å, in thickness. The intermediate layer 40b is "nitrogen stuffed", i.e., is deposited under an atmosphere of from about 10% to about 20% nitrogen, with the balance being a noble gas such as argon. This intermediate layer 40b is generally from about 1000 Å to about 3000 Å, and more preferably about 2000 Å, in thickness. The uppermost layer 40c, which is closest to the bump, is again deposited under a noble gas such as argon. It is generally from about 300 Å to about 700 Å, more preferably about 500 Å, in thickness.

While specific embodiments of the adhesion pad have been discussed with reference to FIGS. 2 and 3, it will be understood that variations within or modifications to the adhesion pad will be apparent to those of ordinary skill in the art in light of the above disclosure. Such modifications may include using substitute materials having similar properties, varying the number of layers in the adhesion pad to provide the same result, using smaller or greater dimensions, providing a variety of different shapes for the adhesion pad, and so forth, to achieve substantially the same results in substantially the same way. For example, a three-layer structure can be used in the adhesion pad, combining a two-layer titanium/tungsten barrier layer with an overlaying gold bonding layer.

An improved method for forming a bond pad structure of the invention herein generally includes the steps of forming an adhesion pad on one or more bond pads; sorting a wafer and marking the bad dies; cleaning the wafer; and forming a ball bump on each individual adhesion pad of a "good" die. The dice are then re-tested. Alternately, the entire wafer may be ball-bumped prior to testing. The wafer is then diced, and good chips are processed by TAB methods and encapsulated in a standard package.

Specifically, a method for forming an adhesion pad herein includes the steps of: applying adhesion pad materials over the surface of the wafer; removing the adhesion pad materials selectively to produce adhesion pads over at least one bond pad on a good die of the wafer; and forming a ball bump on the adhesion pad.

A barrier layer material and a bonding layer material are each coated over the wafer surface. For purposes of example only, the provision of metal layers on the surface of the wafer will be shown with reference to sputtering processes such as a sputtering target method. Other methods, including vapor deposition, evaporation, and the like, may also be appropriate for the provision of the adhesion pad.

EXAMPLE 1

Barrier Layer Material: Titanium/Tungsten Alloy

A barrier layer material is deposited on the surface of a semiconductor wafer.

A semiconductor wafer is loaded into a Varian 3190 Sputter System (Varian Associates, Palo Alto, Calf.). A layer of titanium/tungsten alloy (10:90 by atomic weight) is sputtered over the surface of a wafer under a 100% argon atmosphere to a thickness of about 0.25 μm according to the manufacturer's instructions.

EXAMPLE 2

Barrier Layer Material: Alternate Materials

An alternate barrier layer material is deposited on the surface of a semiconductor wafer.

The titanium/tungsten alloy deposited in Example 1 is substituted with chromium, palladium, or platinum.

EXAMPLE 3

Barrier Layer Material: Nitrogen-Stuffed Titanium/Tungsten Alloy

A barrier layer material having three separate strata is deposited on the surface of a semiconductor wafer. The first stratum and third stratum are titanium/tungsten alloy. The second (intermediate) stratum is nitrogen-stuffed titanium/tungsten alloy.

A first layer of titanium/tungsten alloy (10:90 by atomic weight) is sputtered over the surface of a wafer under a 100% argon atmosphere, to provide a thickness of about 500 Å.

A second layer of titanium/tungsten alloy (10:90 by atomic weight) is sputtered over the surface of the wafer, under an atmosphere of about 10% to about 20% nitrogen, with the balance being a noble gas such as argon. This second layer is about 2000 Å in thickness. The second layer is referred to as being "nitrogen stuffed", and has an increased nitrogen content as contrasted to the first and third layers.

A third layer of titanium/tungsten alloy (10:90 by atomic weight) is sputtered over the surface of the wafer, under a 100% argon atmosphere, to a thickness of about 500 Å.

EXAMPLE 4

Bonding Layer Material: Gold

A bonding layer consisting of sputtered gold is deposited on the surface of a semiconductor wafer which has previously been layered with a barrier material according to Example 1, 2 or 3.

A layer of gold, preferably having a 99.99% purity, is sputtered onto the surface of the wafer which has been coated with a barrier material according to Example 1, 2, or 3. The gold layer is deposited to a thickness of about 2000 Å.

EXAMPLE 5

Bonding Layer Material: Alternate Materials

A bonding layer consisting of sputtered copper is deposited on the surface of a semiconductor wafer which has previously been layered with a barrier material according to Example 1, 2 or 3.

Copper is substituted for gold in the process of Example 4. The copper layer is deposited to a thickness of about 2000 Å.

EXAMPLE 6

Adhesion Pads are Defined

The adhesion pad material (both the barrier layer and the bonding layer) deposited in Examples 1 through 5 is selectively removed from the surface of the wafer using photolithography. Other methods for selective removal of metal layers may be appropriate, as known to the art.

"Islands" of adhesion material are defined over the bond pad by depositing a film of photoresist over the working face of the wafer. A preliminary "soft bake" can be used, in conformance with the manufacturer's directions. The photoresist is then exposed to ultraviolet light through a properly designed via mask, to define the adhesion island location and shape. The islands can be any convenient shape, such as round, square, octagonal, eccentric, and the like. The islands are centered over each pad location, completely covering the bond pad and overlapping the passivation layer to a greater or lesser degree. Adhesion problems would be created if any aluminum were exposed to chemical etchants required later in the processing, resulting in the potential for inadequate ball bump adhesion.

Once the photoresist is developed, it may be hard baked. Undeveloped photoresist is stripped, and the surface of the wafer is cleaned. The adhesion pad (the lower barrier layer and the upper bonding layer) is defined where it is not covered and protected by photoresist material. This defines the "islands" of adhesion material in position above the bond pads. The photoresist material is then stripped off. The wafer surface may be cleaned.

EXAMPLE 7

Ball Bump Formation

Ball bumps are formed on the surface of the barrier layer, which comprises the upper layer of the bond pads. A conventional ball bumper is used. Ball bumper machines sequentially form individual ball bumps at a specified location. A variety of ball bumper machines are known to the art. Bumping time is generally less than 0.2 seconds, and more commonly 0.1 seconds. Gold wire having a diameter of 35 microns or less, more generally 30 microns or less, in diameter, is used. Generally, the narrower the pitch required, the smaller the diameter of gold wire used to form the ball bumps. The gold wire is generally 98% gold, doped with 2% palladium. The palladium is added to control wire breaking and to allow uniform "tail" length.

Preferably, a coining procedure is used to control the final height of the ball bumps. The ball bond tool in the ball bumping machine is replaced with a coining tool. The wafer is heated to a temperature of from about 175° C. to about 225° C. Pressure is applied to individual ball bumps to flatten them to an appropriate height.

EXAMPLE 8

Sorting, TAB Bonding, and Packaging

Individual dies on the wafer are tested in a sorting process, and the bad dies are inked or marked by a laser or other physical method, or the wafer is computer-mapped to record the position of the bad dies.

The finished wafer is diced, and good dies are picked and placed. The good dies are used in TAB processes, in which inner lead bonds are formed to a lead/tape structure, and encapsulated in standard packaging. For example, when using TAB techniques, the integrated circuit die is electrically and mechanically connected to the lead system: the ball bumps of the semiconductor die are positioned to contact the electrical leads of a lead system. The inner lead bond can then be produced using a single lead bonder of the prior art. The single lead bonder uses a relatively low temperatures (175° to 200° C. is usual) and pressure (25 to 50 gm is usual) to bond one lead finger to one bond pad structure in one maneuver. However, because of the combined attributes of stability of the bond pad structure, the adhesion pad, and the gold bumps, the inner lead bonds can be "gang bonded". That is, multiple inner lead bonds can be formed at one time, thus connecting a multiplicity of bond pads to separate and individual leads. Gang bonding uses a higher temperature (in the range of 475° to 525° C.) to bond several inner lead bonds at one time. This can be done, for example, using a Farco F102 ILB Bonder (Farco, Inc., Switzerland).

While the invention has been described in connection with several exemplary embodiments, it will be understood that many modifications will be apparent to those of ordinary skill in the art in light of the above disclosure. Such modifications may include using substitute materials, smaller or greater dimensions, more than one die in a package, different types of bond pads, encapsulated integrated circuit devices, a variety of different shapes for conductors, insulators and so forth, to achieve substantially the same results in substantially the same way. Reference to the following claims should be made to determine the scope of the claimed invention.

We claim:

1. A method of forming an adhesion pad and ball bump structure on a surface of a semiconductor wafer, said method comprising:

(a) depositing a barrier material onto the surface of the wafer;

(b) depositing a bonding material onto the surface of the barrier material;

(c) coating the wafer with a photoresist material;

(d) processing the photoresist material to define an adhesion pad, including a barrier material and a bonding material, above a bond pad, and removing the photoresist material which does not define the adhesion pad;

(e) etching the material not protected by the photoresist;

(f) removing the photoresist material present after step (e) to expose the adhesion pad;

(g) testing the wafer to determine good dies; and (h) forming a ball bump on the adhesion pad of good dies.

2. A method of claim 1 wherein a layer of titanium/tungsten alloy provides the barrier material; and a layer of sputtered gold provides the bonding material.

3. A method of claim 2 further comprising depositing a first layer of titanium/tungsten alloy, depositing a second layer of nitrogen-stuffed titanium/tungsten alloy over said first layer, and depositing a third layer of titanium/tungsten alloy over said second layer to form said barrier material.

\* \* \* \* \*